United States Patent [19]

Ekkanath-Madathil et al.

[11] Patent Number: 5,744,830
[45] Date of Patent: Apr. 28, 1998

[54] SEMICONDUCTOR DEVICE

[75] Inventors: Sankaranarayanan Ekkanath-Madathil, Leicester, England; Qin Huang, Blacksburg, Va.; Gehan Anil Joseph Amaratunga, Cambridge, England; Naoki Kumagai, Matsumoto, Japan

[73] Assignee: Fuji Electric Co., Ltd., Tokyo, Japan

[21] Appl. No.: 556,621

[22] Filed: Nov. 13, 1995

[30] Foreign Application Priority Data

Nov. 14, 1994 [GB] United Kingdom ............... 9423424

[51] Int. Cl.$^6$ ............... H01L 29/74; H01L 29/76
[52] U.S. Cl. ............ 257/140; 257/141; 257/146; 257/147; 257/155; 257/162; 257/343
[58] Field of Search ............... 257/66, 139, 141, 257/147, 155, 162, 212, 288, 343, 140, 146

[56] References Cited

U.S. PATENT DOCUMENTS 5,548,150  8/1996  Omura et al. ............... 257/66

Primary Examiner—Steven H. Loke
Attorney, Agent, or Firm—Morrison Law Firm

[57] ABSTRACT

A semiconductor device made of a lightly doped region of a first conductivity type has a well formed of a second conductivity type. The well extends to the surface of the device. First, second and third heavily doped regions of the first conductivity type are in the surface of the well. An electrode is fixed to the first heavily doped region of the first conductivity type. The third heavily doped region of the first conductivity type adjoins the lightly doped region of the first conductivity type. The first and second heavily doped regions of the first conductivity type are spaced apart from one another so that a portion of the well extends to the surface of the device therebetween. A first gate electrode is fixed via an insulating layer to a portion of the well extending between the first and second heavily doped regions. The first and third heavily doped regions of the first conductivity type are spaced apart from one another so that a portion of the well extends therebetween. A second gate electrode is fixed via an insulating layer to the portion of the well extending between the first and third heavily doped regions. Finally, a heavily doped region of the second conductivity type in the surface of the well is electrically connected to the second heavily doped region of the first conductivity type.

13 Claims, 7 Drawing Sheets

SEMICONDUCTOR DEVICE

BACKGROUND OF THE INVENTION

The present invention relates to a semiconductor device, and in particular, to a device having the desirable low on-state resistance of a conventional Lateral Insulated Gate Bipolar Transistor (LIGBT) device while having the very rapid switch-off time of a conventional Lateral Double-diffused MOS (LDMOS) device.

High voltage/high power semiconductor devices are well known. Lateral versions are preferred for integrated circuits. One known form is the double-diffusion MOS (LDMOS). The properties of the LDMOS device are well known. The device is desirable since it is a lateral device with all of its electrodes on the surface, thus allowing easy interconnections with other circuit elements. However, the on-resistance of the device is relatively high because of the light doping of the epitaxial layer which forms the drift region.

Referring to FIG. 1, a conventional LDMOS device, shown generally at 100, includes an n⁻ epitaxial layer 2 formed on a p⁻ substrate 1. A transistor drain, n⁺ drain 3, is formed by an n⁺ region on the surface of n⁻ epitaxial layer 2.

A drain electrode 4 is fixed to n⁺ drain 3. A p well 5, laterally displaced from n⁺ drain 3, is formed on the surface of n⁻ epitaxial layer 2. Adjacent p⁺ type region 6 and n⁺ type region 7 are formed in the surface of p well 5.

N⁺ region 7 serves as a transistor source while p well 5 acts as a transistor body in which the MOS transistor gate controls surface channel conduction. A source electrode 8 is fixed to the surface of an n⁺ region, n⁺ source 7 and its adjacent p⁺ type region 6. A gate electrode 9 is fixed via an oxide layer 10 to the surface of device 100 so that gate electrode 9 extends from n⁺ source 7, over the portion of p well 5 which extends to the surface of conventional LDMOS device 100, and over the surface of n⁻ epitaxial layer 2, thereby forming gate electrode 9.

As an improvement over the LDMOS device, another known lateral device is the lateral insulated gate bipolar transistor (LIGBT). Referring to FIG. 2, a conventional LIGBT device, shown generally at 102, includes an n⁻ epitaxial layer 12 formed on a p⁻ substrate 11. A p⁺ region, p⁺ anode 13, is formed on the surface of n⁻ epitaxial layer 12. This p⁺ anode 13 forms the anode of the transistor. An electrode 14 is fixed to p⁺ anode 13.

A p well 15 is formed on the surface of n⁻ epitaxial layer 12 laterally displaced from p⁺ anode 13. A gate electrode 16 is fixed via an oxide layer 17 to the p well 15. Two regions, a p⁺ type region 18 adjacent to an n⁺ type region, are formed in the surface of p well 15. The n⁺ type region forms n⁺ cathode 19. An electrode 20 is fixed to p⁺ type region 18 and n⁺ cathode 19. Gate electrode 16 extends from n⁺ cathode 19, over a portion of p well 15 which extends to the surface and over the surface of n⁻ epitaxial layer 12, thereby forming gate electrode 16.

It should be noted that gate electrode 16 extends from n⁺ cathode 19 over the portion of p well 15 which extends to the surface of conventional LIGBT device 102, to the surface of n⁻ epitaxial layer 12. In addition, an n⁻ type buffer region 21 is formed under p⁺ anode 13 to prevent punch-through.

In the on-state of the LIGBT device, minority carriers (in this case, holes) are injected from p⁺ anode 13 into the drift region formed in n⁻ epitaxial layer 12 between the anode and the cathode, thus modulating the conductivity of the drift region. Accordingly, conventional LIGBT device 102 is a bipolar device utilizing conductivity modulation of the drift region. This lowers the resistance of the drift region relative to a comparable LDMOS device. As a consequence, LIGBT devices exhibit high input impedance, high breakdown level and low on-state resistance, thus making LIGBT devices attractive for power IC applications.

However, a serious disadvantage is that the injected minority carriers slow the switching speed of the LIGBT device relative to the LDMOS device because the switch-off time is determined by the speed of the recombination process of the injected minority carriers.

Other longstanding problems are solved by the subject matter of the present invention.

OBJECTS AND SUMMARY OF THE INVENTION

In view of the above problems, an object of the present invention is to overcome the drawbacks and limitations of conventional semiconductor devices.

Another object of the present invention is to provide a semiconductor device with the desirable low on-state resistance of a conventional LIGBT device together with the very rapid switch-off time of a conventional LDMOS device.

Another object of the present invention is to provide a semiconductor device which has a very low on-state resistance and which also allows very fast switch-off.

Briefly stated, a semi-conductor device includes a well, of a second conductivity type, formed in a lightly doped region of a first conductivity type. The well extends to the surface of the device. First, second and third heavily doped regions of the first conductivity type are in the surface of the well.

An electrode is fixed to the first heavily doped region of the first conductivity type. The third heavily doped region of the first conductivity type adjoins the lightly doped region of the first conductivity type.

The first and second heavily doped regions of the first conductivity type are spaced apart from one another so that a portion of the well extends to the surface of the device therebetween. A first gate electrode is fixed via an insulating layer to a portion of the well extending between the first and second heavily doped regions.

The first and third heavily doped regions of the first conductivity type are spaced apart from one another so that a portion of the well extends therebetween. A second gate electrode is fixed via an insulating layer to the portion of the well extending between the first and third heavily doped regions. Finally, a heavily doped region of the second conductivity type in the surface of the well is electrically connected to the second heavily doped region of the first conductivity type.

According to an embodiment of the present invention, a semi-conductor device includes a first lightly doped region of a first conductivity type, a first well of a second conductivity type, formed in the first lightly doped region, the first well extending to a first surface of the first lightly doped region, a first heavily doped region of the first conductivity type, formed in a surface of the first well, the first heavily doped region having an electrode fixed thereto, a second heavily doped region of the first conductivity type in the surface of the first well, a third heavily doped region of the first conductivity type in the surface of the first well, adjoining the first lightly doped region of the first conductivity type, the first and second heavily doped regions of the first conductivity type spaced from one another so that a first portion of the first well extends to the surface of the lightly doped region of the first conductivity type therebetween, a first gate electrode fixed via an insulating layer to the first portion of the first well, the first and third heavily doped regions of the first conductivity type spaced from one another so that a second portion of the first well extends therebetween, a second gate electrode fixed via an insulating layer to the second portion of the first well, a heavily doped region of the second conductivity type, in the surface of the first well, and the heavily doped region of the second conductive type electrically connected to the second heavily doped region of the first conductivity type.

According to another embodiment of the present invention, a method provides a low on-state resistance and a rapid switch-off time in a semiconductor device, comprising: providing first, second and third MOS transistors in a substrate to form the semiconductor device, forming an anode structure from the second and third MOS transistors, providing first, second, and third gate electrodes for the first, second, and third MOS transistors, respectively, turning on the semiconductor device by the steps of applying a positive anode voltage to a first anode region of the anode structure, applying a positive first voltage to the first gate electrode, thereby turning on the first transistor, applying a second voltage to the second gate electrode to turn on the second transistor, the second voltage being greater than the anode voltage, thereby injecting a plurality of minority carriers into a drift region of the substrate, and turning off the semiconductor device by the steps of lowering the second voltage below the anode voltage, thereby turning the second MOS transistor off, applying a third voltage to the third gate electrode, the third voltage being greater than the anode voltage, thereby turning the third MOS transistor on and sweeping out the plurality of minority carriers from the drift region of the substrate, and removing the first voltage from the first gate electrode, thereby turning the first MOS transistor off.

According to another embodiment of the present invention, a semiconductor device includes first, second and third MOS transistors in a substrate to form the semiconductor device, an anode structure formed from the second and third MOS transistors, first, second, and third gate electrodes in the first, second, and third MOS transistors, respectively, means for turning on the semiconductor device, the means for turning on the semiconductor device including means for applying a positive anode voltage to a first anode region of the anode structure, means for turning on the first transistor by applying a positive first voltage to the first gate electrode, means for turning on the second transistor by applying a second voltage to the second gate electrode, the second voltage being greater than the anode voltage, thereby injecting a plurality of minority carriers into a drift region of the substrate, and means for turning off the semiconductor device, the means for turning off the semiconductor device including means for turning off the second MOS transistor by lowering the second voltage below the anode voltage, means for turning on the third MOS transistor by applying a third voltage to the third gate electrode, the third voltage being greater than the anode voltage, thereby sweeping out the plurality of minority carriers from the drift region of the substrate, and means for turning off the first MOS transistor by removing the first voltage from the first gate electrode.

The above, and other objects, features and advantages of the present invention will become apparent from the following description read in conjunction with the accompanying drawings, in which like reference numerals designate the same elements.

DETAILED DESCRIPTION OF PREFERRED EMBODIMENT

Figure 1:
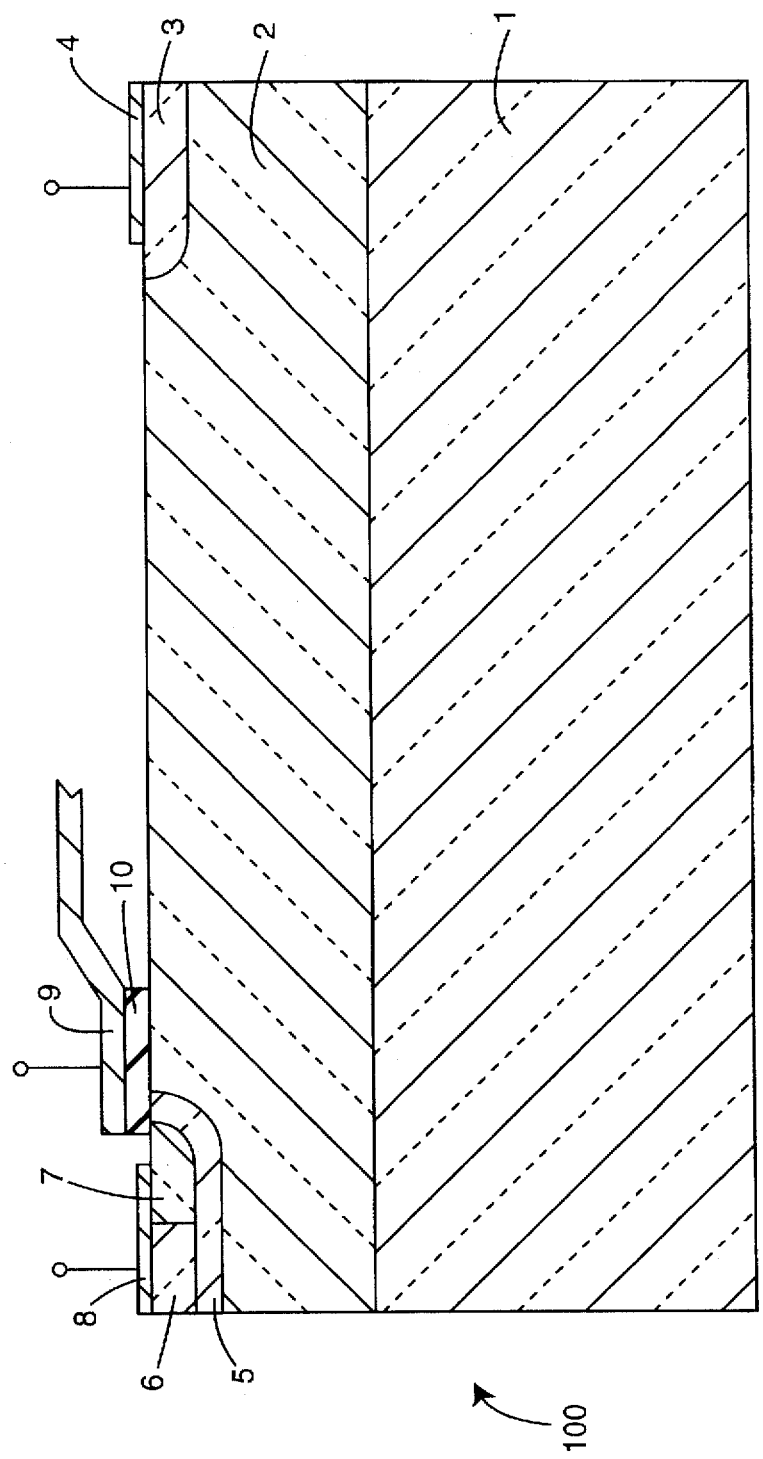
FIG. 1 is a section view of a conventional LDMOS.
Figure 2:
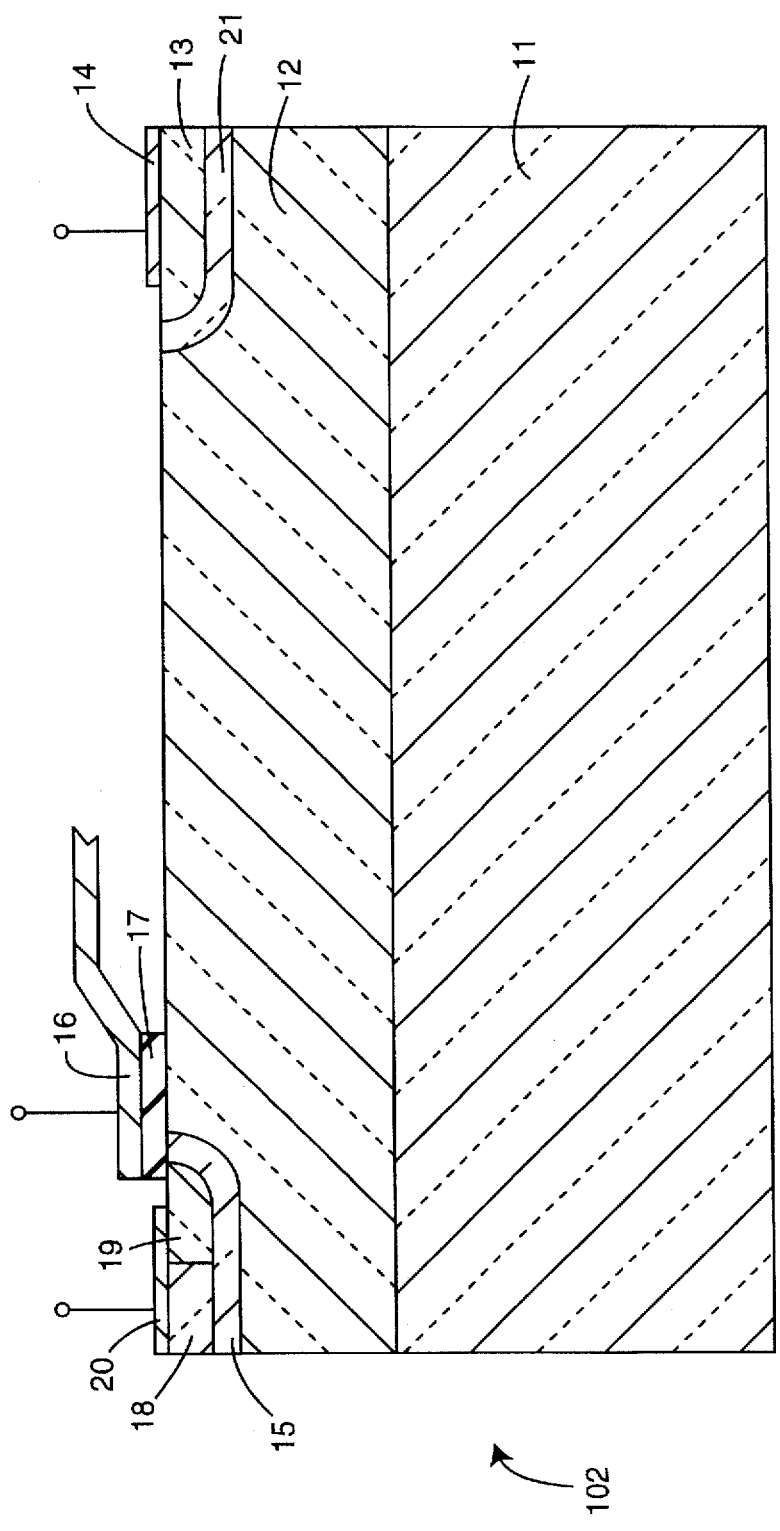
FIG. 2 is a section view of a conventional LIGBT device.
Figure 3A:
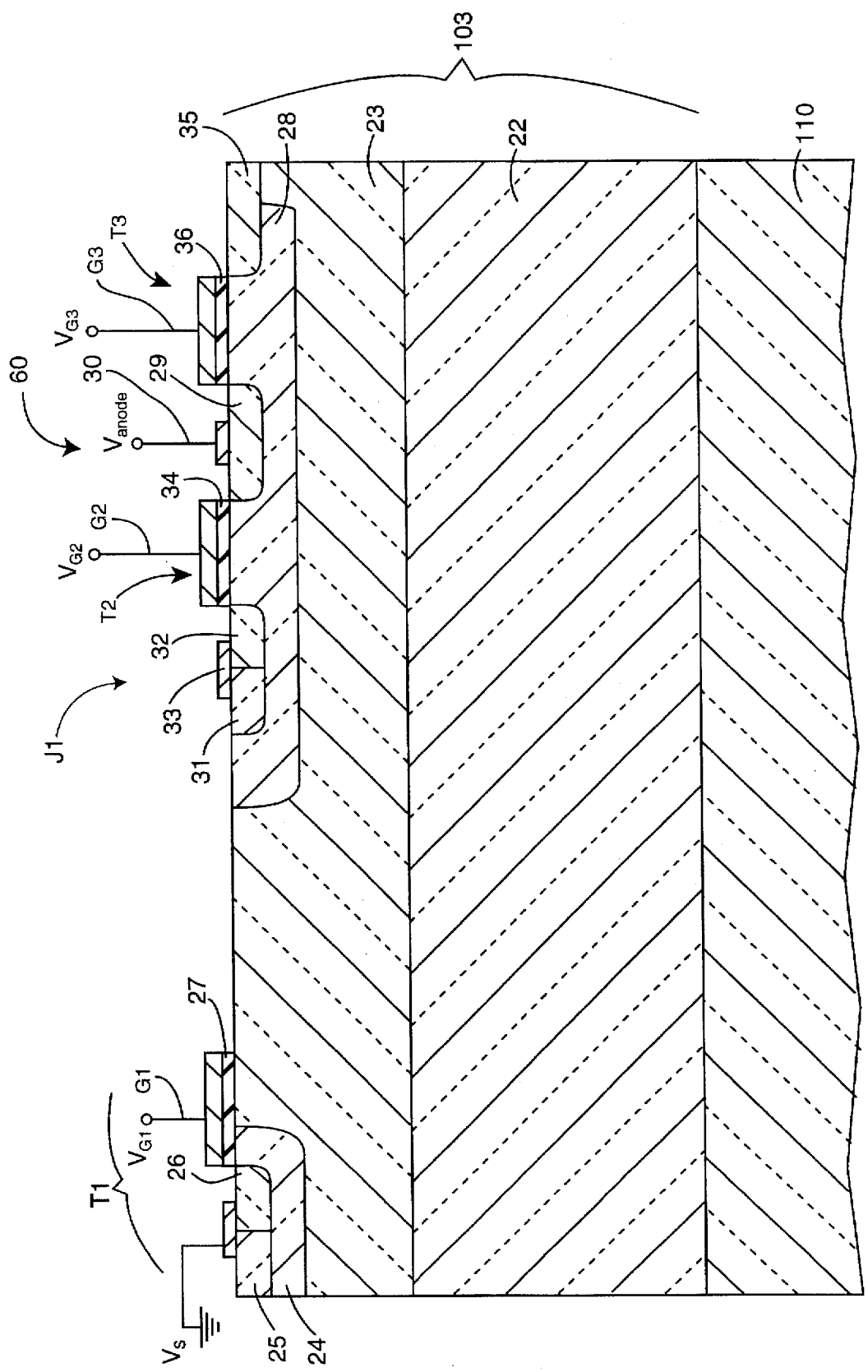
FIG. 3(a) is a section view of a device according to an embodiment of the present invention.

Referring to FIG. 3(a), a device generally shown at 103 includes an $n^-$ drift region 23 as an $n^-$ epitaxial layer formed on a $p^-$ substrate 22. A first p well 24 is formed in the surface of $n^-$ drift region 23 at the cathode/source side of the device. A cathode $p^+$ region 25 and an adjacent cathode $n^+$ region 26 are formed in the surface of first p well 24. Cathode $p^+$ region 25 and cathode $n^+$ region 26 act together as the cathode/source of device 103. First p well 24 extends under $p^+$ region 25 and cathode $n^+$ region 26 to the surface of $n^-$ drift region 23.

A first gate electrode G1 is on an insulating oxide layer 27. Insulating oxide layer 27 is on the surface of the device 103 and extends from that portion of first p well 24 which passes to the surface of $n^-$ drift region 23 over an immediately adjacent surface portion of $n^-$ drift region 23. Cathode $p^+$ region 25 and cathode $n^+$ region 26 are grounded to a reference potential.

Cathode $n^+$ region 26, first p well 24, $n^-$ drift region 23 and first gate electrode G1 effectively form a first MOS transistor T1.

An anode structure 60 is formed a specified distance from first MOS transistor T1 by forming a second p well 28 in the surface of $n^-$ drift region 23 at a position laterally displaced from first p well 24. Second p well 28 is relatively wider than first p well 24 and acts generally as the anode/emitter of device 103.

A first anode $n^+$ region 29 is formed in the surface of second p well 28. First anode $n^+$ region 29, to which an electrode 30 is fixed, is located generally centrally of second p well 28.

An anode $p^+$ region 31 and a second anode $n^+$ region 32, adjacent to anode $p^+$ region 31, are formed in the surface of second p well 28, on the cathode side of first anode $n^+$ region 29. A metal contact 33 is across anode $p^+$ region 31 and second anode $n^+$ region 32, so that anode $p^+$ region 31 and second anode $n^+$ region 32 are at the same potential.

Second anode $n^+$ region 32 is closer to first anode $n^+$ region 29 than anode $p^+$ region 31. Second anode $n^+$ region 32 is laterally spaced apart from first anode $n^+$ region 29 to allow a portion of anode second p well 28 to extend to the surface of device 103 between first anode $n^+$ region 29 and second anode $n^+$ region 32.

A second gate electrode G2 is fixed via an insulating oxide layer 34 over the portion of anode second p well 28 which extends between first anode $n^+$ region 29 and second anode $n^+$ region 32, thus forming a second MOS transistor T2. Furthermore, the portion of second p well 28 under the two regions, anode $p^+$ region 31 and second anode $n^+$ region 32, together with the adjacent portion of the $n^-$ drift region 23 form a p-n junction J1.

A third anode n⁺ region 35 is formed in the surface of anode second p well 28 on the other side of first anode n⁺ region 29. Third anode n⁺ region 35 is laterally spaced apart from first anode n⁺ region 29 to allow a portion of anode second p well 28 to extend to the surface of the n⁻ drift region 23 between the first anode n⁺ region 29 and the third anode n⁺ region 35.

A third gate electrode G3 is fixed via an insulating oxide layer 36 over the portion of the anode second p well 28 which extends between the first anode n⁺ region 29 and the third anode n⁺ region 35, thus forming a third MOS transistor T3. The device described above may optionally be formed on an insulating layer 110.

A positive voltage $V_{G1}$ is applied to first gate electrode G1 to turn on device 103. Voltage $V_{G1}$ turns on first MOS transistor T1 on the cathode/source side of the device, allowing injection of majority carriers (electrons) into n⁻ drift region 23.

A voltage $V_{G2}$ applied to second gate electrode G2 is then made greater than an anode voltage $V_A$ ($V_{G2}>V_A$) to turn on second MOS transistor T2. Turning on second MOS transistor T2 electrically connects the anode voltage $V_A$ to the shorted anode p⁺ region 31, and second anode n⁺ region 32. Thus, anode voltage $V_A$ is applied to anode p⁺ region 31. Consequently, because anode voltage $V_A$ is positive, p-n junction J1 is forward biased. Minority carriers (holes) are thus injected into n⁻ drift region 23, modulating the conductivity of n⁻ drift region 23, to obtain LIGBT-like action and turn device 103 on.

Three steps are involved in turning off device 103. The first step is turning off second MOS transistor T2 by making voltage $V_{G2}$ applied to second gate electrode G2 lower than anode voltage $V_A$ ($V_{G2}<V_A$). This disconnects the shorted anode p⁺ region 31 and second anode n⁺ region 32 from the anode voltage $V_A$. Consequently, p-n junction J1 is no longer forward biased and injection of minority carriers stops.

The second step is turning on third MOS transistor T3 by making a voltage $V_{G3}$ applied to third gate electrode G3 greater than anode voltage $V_A$ ($V_{G3}>V_A$). This second step is preferably performed at the same time as the first step of lowering voltage $V_{G2}$ applied to second gate electrode G2. This effectively applies the anode voltage $V_A$ to n⁻ drift region 23 via third anode n⁺ region 35. Consequently, device 103 includes a LDMOS-like action and all of the minority carriers (holes) are swept out.

The third step is turning off first MOS transistor T1 by removing the voltage $V_{G1}$ applied to first gate electrode G1. This third step turns device 103 off very quickly, provided that a time between the second and third steps (i.e. between turning on third MOS transistor T3 and turning off first MOS transistor T1) is sufficient to sweep out all the minority carriers used for conductivity modulation. Device 103 turns off about as quickly as a conventional LDMOS device. Accordingly, device 103 provides the desirable low on-state resistance of a conventional LIGBT device while having the very rapid switch-off time of a conventional LDMOS device.

Figure 4A:
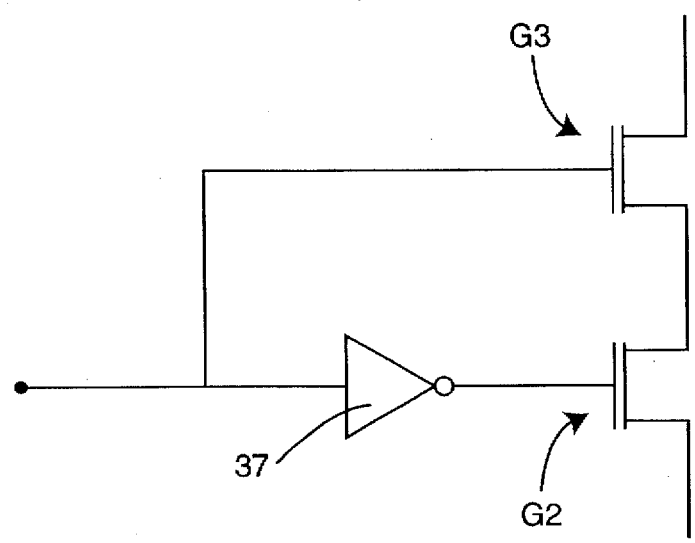
FIGS. 4(a) is a schematic diagram of a suitable circuit for driving of the gate of the device of FIG. 3(a).

Second and third gate electrodes G2 and G3 can be operated independently. Alternatively, a circuit as shown in FIG. 4(a) applies a common signal directly to third gate electrode G3 and via an invertor 37 to second gate electrode G2. Thus, as second gate electrode G2 is turned on, third gate electrode G3 is turned off and vice versa.

Figure 3B:
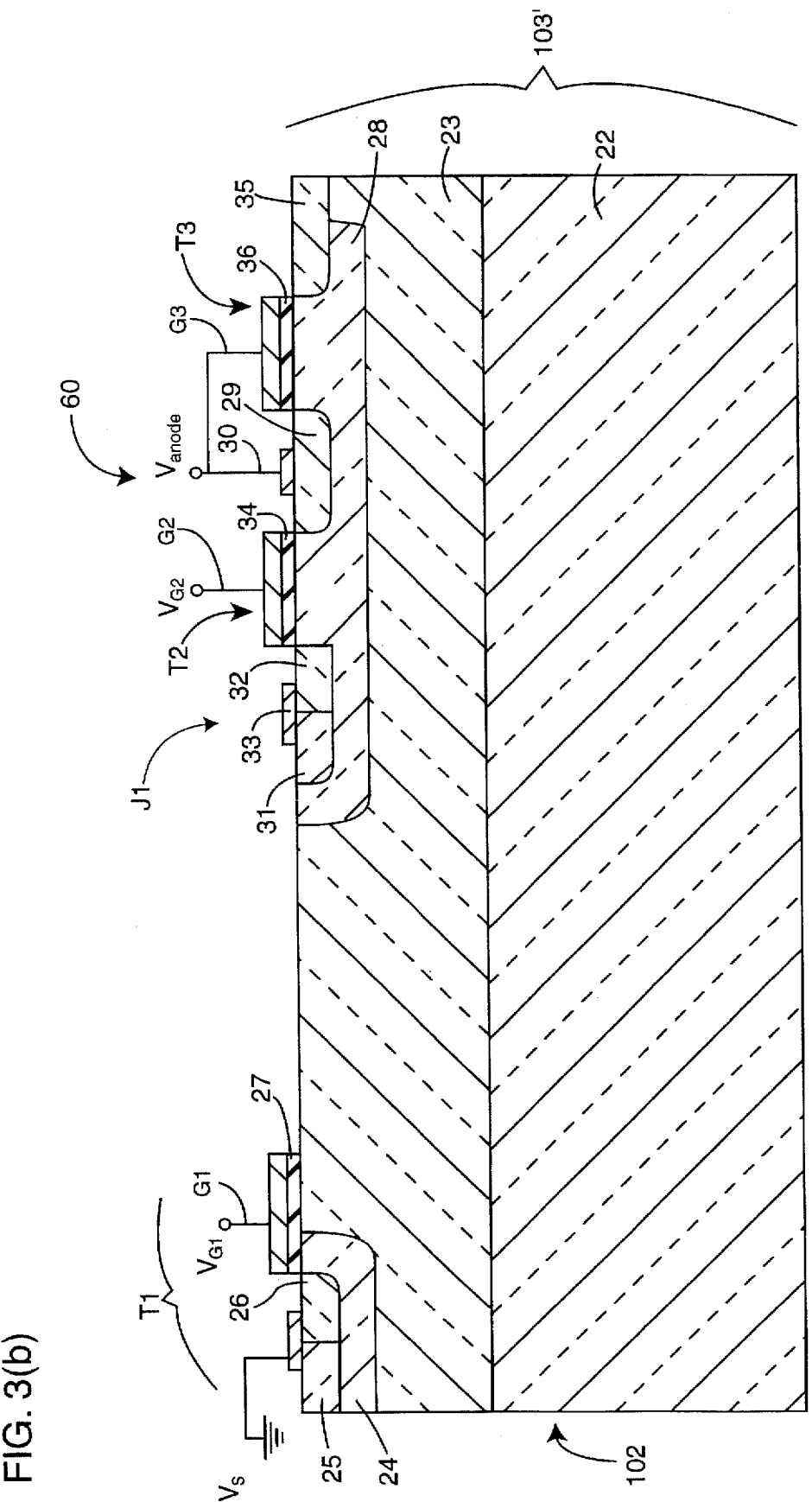
FIG. 3(b) is a section view of a device according to another embodiment of the present invention.
Figure 4B:
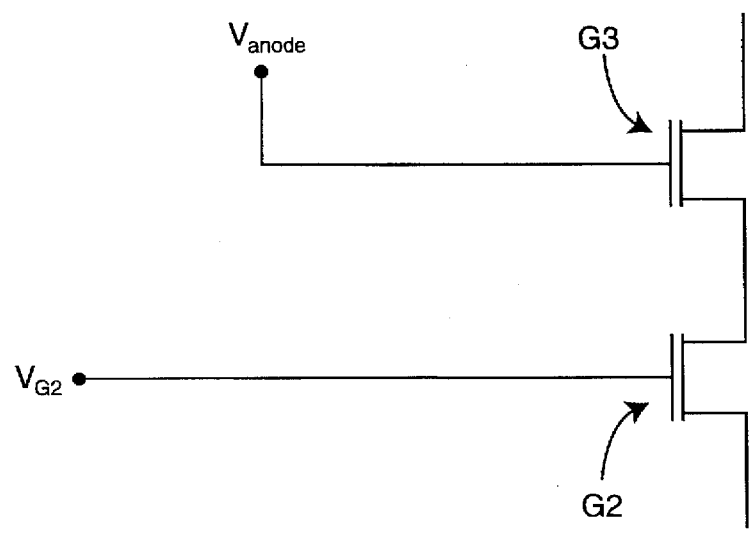
FIGS. 4(b) is a schematic diagram of a suitable circuit for driving of the gate of the device of FIG. 3(b).

Referring to FIG. 3(b), device 103' is shown with third gate electrode G3 connected to anode electrode 30, thereby eliminating the need for independent drive circuitry. The corresponding drive circuit for device 103' is shown in FIG. 4(b).

During operation, the first turn off step causes the anode voltage $V_A$ to rise because the device stops injecting minority carriers and tries to turn off. Since the junction between first anode n⁺ region 29 and second p well 28 is always reverse biased by tying third gate electrode G3 to anode electrode 30, the voltage applied to third gate electrode G3 takes a higher value than the voltage of second p well 28. This causes third MOS transistor T3 automatically to turn on when the second step of the turn off process is initiated.

Figure 5:
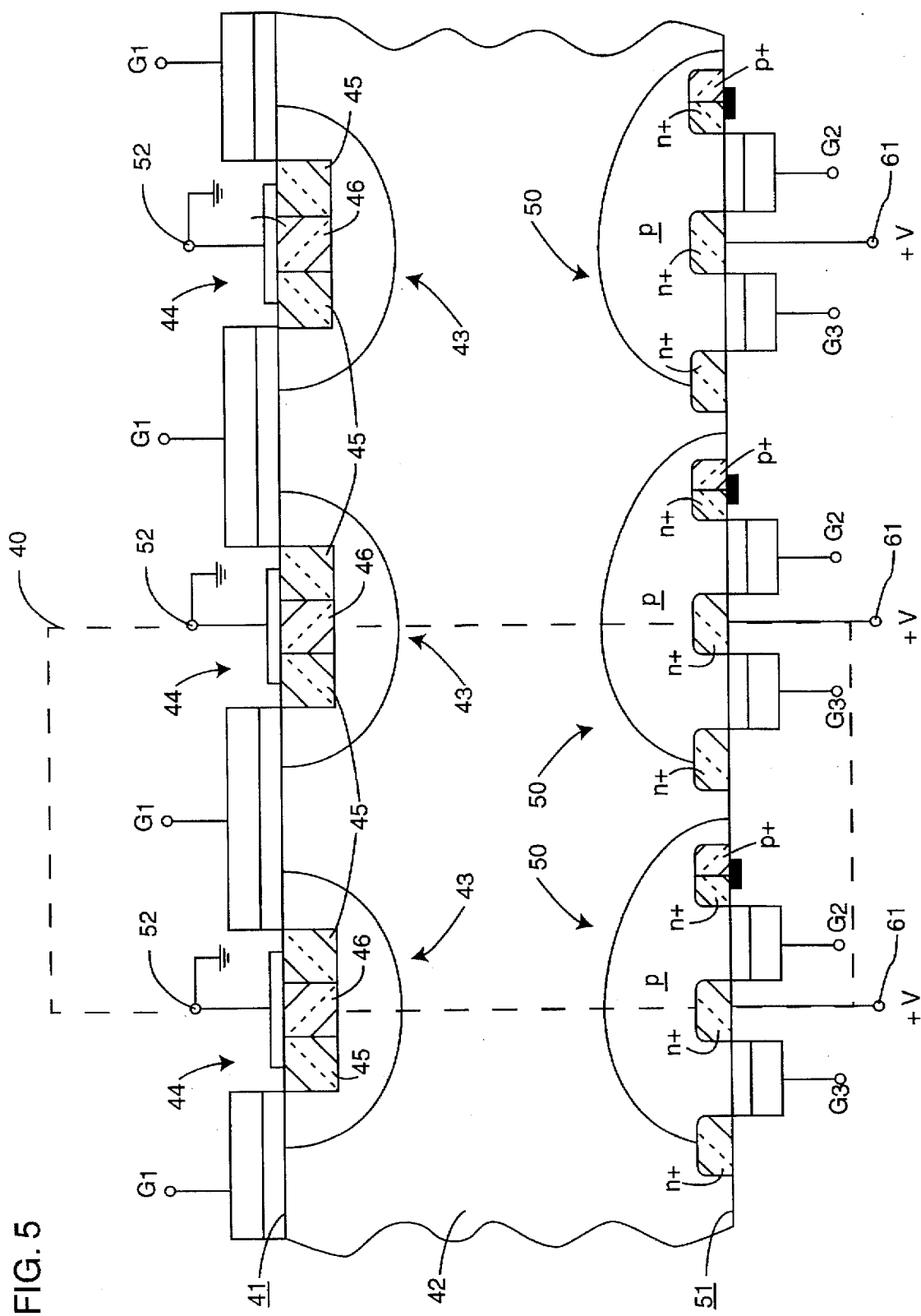
FIG. 5 is a section view of a device according to an embodiment of the present invention.

The two examples described above are lateral devices. Referring to FIG. 5, an embodiment of the present invention includes a vertical device, generally shown at 40. A plurality of such devices are in plurality in parallel on the same substrate. Much of the structure of vertical device 40 shown in FIG. 5 is similar to lateral device 103 shown in FIG. 3(a) and, accordingly, the following description will only highlight the differences.

A cathode structure 43 is formed on an upper face 41 of a n⁻ layer 42. Cathode structure 43 includes a p well 44 with a cathode p⁺ type surface region 45 and a cathode n⁺ type surface region 46 as in lateral device 103 described above.

A first gate electrode G1 is formed to extend from cathode n⁺ type surface region 45, over the portion of p well 44 extending to surface 41 of n⁻ layer 42, and over the portion of n⁻ layer 42 extending to the surface of device 40. The cathode structure 43 is mirrored on the other side of the unit cell 40 with a corresponding further cathode structure 43. First gate electrode G1 extends over p well 44 of adjacent cathode structure 43.

An anode structure 50 is formed on an opposite face 51 of n⁻ layer 42. Anode structure 50 of vertical device 40 is identical to that of lateral device 103 shown in FIG. 3(a). The basic anode structure 50 is repeated across opposite face 51 of n⁻ layer 42 to provide further anode structures 50 corresponding to the repeating cathode structures 43 on upper face 41 of n⁻ layer 42.

The basic unit cell of vertical device 40 is formed by one portion of a first anode structure 50 and a portion of the neighboring anode structure 50.

Operation of vertical device 40 is as described above for lateral device 103 of FIG. 3(a).

Figure 6:
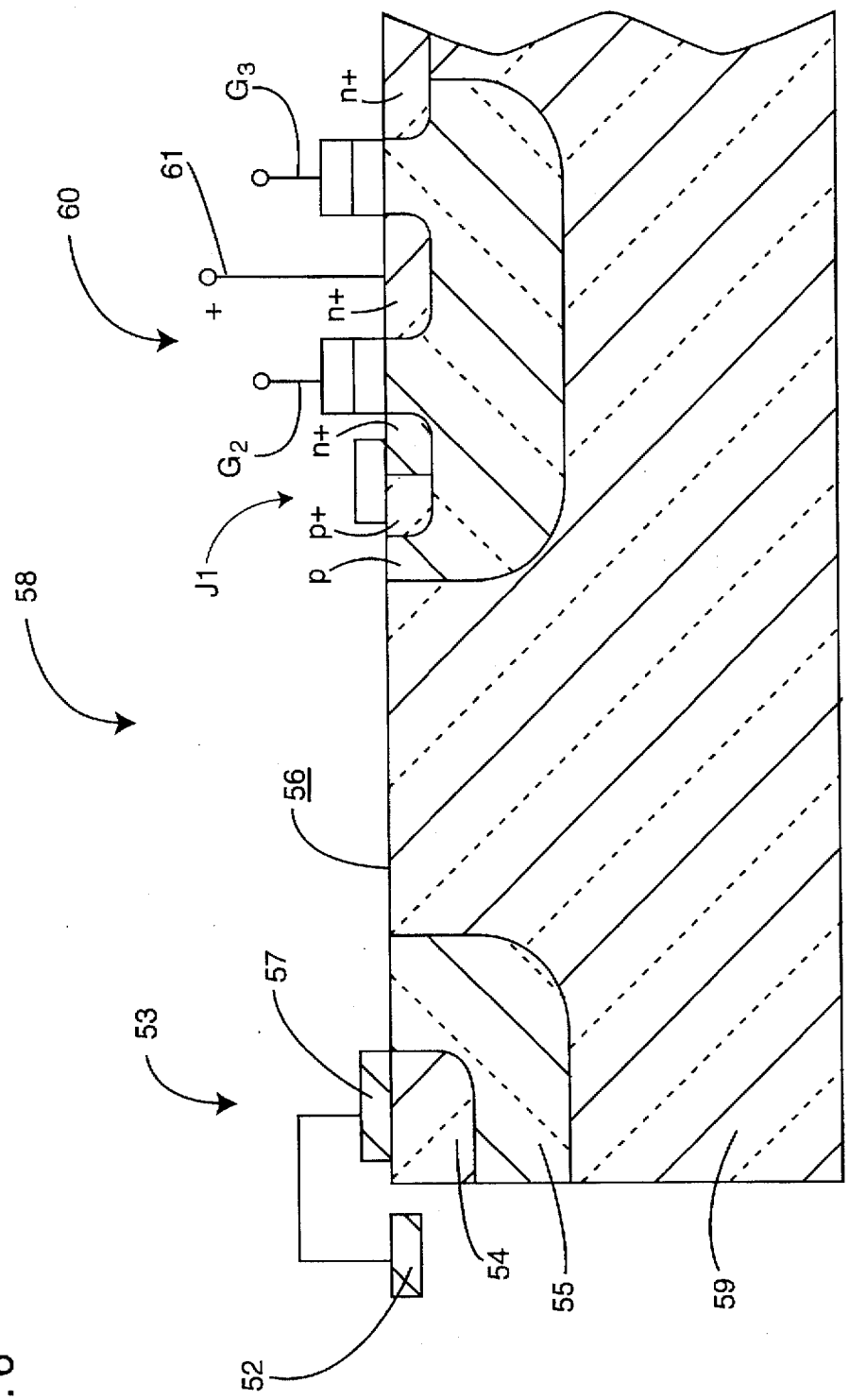
FIG. 6 is a section view of a device according to an embodiment of the present invention.

Referring to FIG. 6, there is shown a device, generally shown at 58, which is a simpler version of lateral device 103. Device 58 includes a diode (rectifier) action. Device 58 is a lateral device having an anode structure 60 formed on an n⁻ epitaxial layer 59, identical to anode structure 60 of lateral device 103 of FIG. 3(a).

Cathode structure 53 includes a surface n⁺ region 54 formed in an n well 55. N well 55 is itself formed in n⁻ epitaxial layer 59 so that a portion of n well 55 extends to a surface 56 of n⁻ epitaxial layer 59. A cathode electrode 57 is fixed to cathode surface n⁺ region 54 and forms the negative terminal.

The operation of device 58 is controlled primarily by voltages applied to second and third gate electrodes G2 and G3. The action of anode structure 60 is similar to the action of anode structure 60 of lateral device 103 shown in FIG. 3(a) and described above in more detail. With anode 61 positive with respect to cathode 52, and with second gate electrode G2 on and third gate electrode G3 off, p-n junction J1 is forward biased. With anode 61 positive with respect to cathode 52, and second gate electrode G2 off and third gate electrode G3 on, p-n junction J1 is no longer forward biased, so that resistor-like characteristics are obtained. With second gate electrode G2 off and third gate electrode G3 off, the structure is effectively an anode—n⁺pn⁻—cathode structure, which is similar to an off-state bipolar transistor and consequently does not conduct current.

Accordingly, device 58 is a MOS controlled rectifier. With second gate electrode G2 on and third gate electrode G3 off, the action is that of a forward biased diode. To allow the diode to become reverse biased very quickly (the reverse recovery), second gate electrode G2 is turned off and third gate electrode G3 is turned on. During this period of switching second gate electrode G2 and third gate electrode G3, device 58 acts as a resistor and is kept in this mode sufficiently long to remove minority carriers (holes) that were injected into n⁻ epitaxial layer 59 in the previous diode mode (with second gate electrode G2 on and third gate electrode G3 off). Third gate electrode G3 is then turned off. Consequently, very fast turn off is achieved.

In another embodiment of the present invention, a vertical embodiment (not shown) of MOS controlled diode device 58 includes the same anode structure 50 formed on opposite face 51 of vertical device 40 of FIG. 5, but additionally includes upper face 41 having a highly doped semiconductor layer of the same type as n⁻ layer 42. For a structure with an anode structure 50 corresponding to that in FIG. 5, a surface layer is a highly doped n type. A cathode contact to the device is made on this highly doped layer on upper face 41.

As with the example shown in FIG. 3(b) described above, in each of the examples described above with reference to FIGS. 5 and 6, third gate electrode G3 can alternatively be connected to anode 61 without requiring a separate connection for driving these two electrodes separately. This alternate connection is a consequence of the anode voltage rising when second gate electrode G2 is turned off. This in turn causes the voltage to third gate electrode G3 to rise (since they are tied or shorted) and further causes third MOS transistor T3 under the third gate electrode G3 to turn on.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A semi-conductor device comprising:

a first lightly doped region of a first conductivity type;

a first well of a second conductivity type, formed in said first lightly doped region;

said first well extending to a first portion of a first surface of said first lightly doped region;

a first heavily doped region of said first conductivity type, formed in a surface of said first well;

said first heavily doped region having an electrode fixed thereto;

a second heavily doped region of said first conductivity type in said surface of said first well;

a third heavily doped region of said first conductivity type in said surface of said first well, adjoining said first lightly doped region of said first conductivity type;

said first and second heavily doped regions of said first conductivity type spaced from one another so that a first portion of said first well extends to said surface of said first well of said second conductivity type therebetween;

a first gate electrode fixed via a first insulating layer to said first portion of said first well;

said first and third heavily doped regions of said first conductivity type spaced from one another so that a second portion of said first well extends therebetween;

a second gate electrode fixed via a second insulating layer to said second portion of said first well;

a heavily doped region of said second conductivity type, in said surface of said first well; and said heavily doped region of said second conductivity type electrically connected by a floating electrode only to said second heavily doped region of said first conductivity type, effective to cause injection of a plurality of carriers from said heavily doped region of said second conductivity type, into said first lightly doped region of said first conductivity type, when a voltage is applied to said first gate electrode.

2. A device according to claim 1, wherein said heavily doped region of said second conductivity type is adjacent to said second heavily doped region of said first conductivity type.

3. A device according to claim 2, wherein said first conductivity type is n type and said second conductivity type is p type.

4. A device according to claim 1, wherein said first conductivity type is n type and said second conductivity type is p type.

5. A device according to claim 1 wherein electrical connection of said heavily doped region of said second conductivity type to said second heavily doped region of said first conductivity type is by an ohmic contact fixed to a surface of said heavily doped region of said second conductivity type and said second heavily doped region of said first conductivity type.

6. A device according to claim 1 further comprising:

a cathode well of said second conductivity type;

said cathode well spaced from said first well;

a first heavily doped cathode region of said first conductivity type formed in the cathode well such that a portion of said cathode well extends to a second portion of said first surface of said first lightly doped region of said first conductivity type;

a second heavily doped cathode region of said second conductivity type adjacent to said first heavily doped cathode region of said first conductivity type;

a cathode gate electrode fixed via a third insulating layer over said portion of said cathode well which extends to a third portion of said first surface of said first lightly doped region of said first conductivity type; and said cathode gate electrode extending over an adjacent portion of said first lightly doped region of said first conductivity type.

7. A device according to claim 6, wherein said device is a lateral device further comprising:

said first heavily doped cathode region of said first conductivity type has a first side and an opposite second side;

said cathode well is on the same first surface of said first lightly doped region of said first conductivity type as said first well of said second conductivity type;

a portion of said cathode well extending to said second portion of said first surface of said first lightly doped region of said first conductivity type adjacent to said first side of said first heavily doped cathode region of said first conductivity type;

said second portion of said first surface of said first lightly doped region of said first conductivity type is between said first heavily doped cathode region of said first conductivity type and said third portion of said first surface of said first lightly doped region of said first conductivity type; and said second heavily doped cathode region of said second conductivity type on said second opposite side of said first heavily doped cathode region of said first conductivity type.

8. A device according to claim 1 wherein said first lightly doped region of said first conductivity type is formed on a lightly doped substrate of said second conductivity type.

9. A device according to claim 1, wherein said device is a vertical device further comprising:

a cathode well is formed on a second surface of said first lightly doped region of said first conductivity type opposite to said surface of said first well of said second conductivity type.

10. A device according to claim 1 wherein said device is formed on an insulating layer.

11. A device according claim 1 further including a cathode region formed by a heavily doped region of said first conductivity type.

12. A method for providing a low on-state resistance and a rapid switch-off time in a semiconductor device, comprising:

providing first, second and third MOS transistors in a substrate to form said semiconductor device;

forming an anode structure from said second and third MOS transistors;

providing first, second, and third gate electrodes for said first, second, and third MOS transistors, respectively;

turning on said semiconductor device by the steps of applying a positive anode voltage to a first anode region of said anode structure;

applying a positive first voltage to said first gate electrode, thereby turning on said first transistor;

applying a second voltage to said second gate electrode to turn on said second transistor, said second voltage being greater than said anode voltage, thereby injecting a plurality of minority carriers into a drift region of said substrate; and turning off said semiconductor device by the steps of lowering said second voltage below said anode voltage, thereby turning said second MOS transistor off;

applying a third voltage to said third gate electrode, said third voltage being greater than said anode voltage, thereby turning said third MOS transistor on and sweeping out said plurality of minority carriers from said drift region of said substrate; and removing said first voltage from said first gate electrode, thereby turning said first MOS transistor off.

13. A semiconductor device, comprising:

first, second and third MOS transistors in a substrate to form said semiconductor device;

an anode structure formed from said second and third MOS transistors;

first, second, and third gate electrodes in said first, second, and third MOS transistors, respectively;

means for turning on said semiconductor device, said means for turning on said semiconductor device including means for applying a positive anode voltage to a first anode region of said anode structure;

means for turning on said first transistor by applying a positive first voltage to said first gate electrode;

means for turning on said second transistor by applying a second voltage to said second gate electrode, said second voltage being greater than said anode voltage, thereby injecting a plurality of minority carriers into a drift region of said substrate; and means for turning off said semiconductor device; said means for turning off said semiconductor device including means for turning off said second MOS transistor by lowering said second voltage below said anode voltage;

means for turning on said third MOS transistor by applying a third voltage to said third gate electrode, said third voltage being greater than said anode voltage, thereby sweeping out said plurality of minority carriers from said drift region of said substrate; and means for turning off said first MOS transistor by removing said first voltage from said first gate electrode.

* * * * *